United States Patent
Nurani et al.

(10) Patent No.: US 12,191,877 B2
(45) Date of Patent: Jan. 7, 2025

(54) MULTI-BIT VOLTAGE-TO-DELAY CONVERSION IN DATA CONVERTER CIRCUITRY

(71) Applicant: Texas Instruments Incorporated, Dallas, TX (US)

(72) Inventors: Sai Aditya Nurani, Bengaluru (IN); Rishi Soundararajan, Bangalore (IN); Nithin Gopinath, Bangalore (IN); Visvesvaraya Pentakota, Bangalore (IN); Shagun Dusad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 17/898,844

(22) Filed: Aug. 30, 2022

(65) Prior Publication Data

US 2024/0072820 A1 Feb. 29, 2024

(51) Int. Cl.
*H03M 1/12* (2006.01)
*H03M 1/44* (2006.01)
(Continued)

(52) U.S. Cl.
CPC ........... *H03M 1/1245* (2013.01); *H03M 1/44* (2013.01); *H03M 1/50* (2013.01); *H03M 1/785* (2013.01)

(58) Field of Classification Search
CPC .... H03M 1/365; H03M 1/141; H03M 1/1014; H03M 1/0646; H03M 1/12; H03M 1/204;
(Continued)

(56) References Cited

U.S. PATENT DOCUMENTS

| | | | |
|---|---|---|---|
| 6,175,323 B1 * | 1/2001 | Flynn | H03M 1/204 341/155 |
| 6,239,733 B1 * | 5/2001 | Lin | H03M 1/204 341/155 |

(Continued)

FOREIGN PATENT DOCUMENTS

DE 102009002062 A1 10/2010

OTHER PUBLICATIONS

Miyahara Masaya et al: "22.6 A 2.2GS/s 7b 27.4mW time-based folding-flash ADC with resistively averaged voltage-to-time amplifiers", IEEE International Solid State Circuits Conference, IEEE Service Center, New York, NY, US, Feb. 9, 2014 (Feb. 9, 2014), pp. 388-389, XP032574937 (Year: 2014).*

(Continued)

*Primary Examiner* — Linh V Nguyen
(74) *Attorney, Agent, or Firm* — John R. Pessetto; Frank D. Cimino

(57) ABSTRACT

An analog-to-digital converter circuit incorporating includes a multi-bit input buffer having a differential input and configured to generate, at a plurality of differential outputs, a plurality of residues of a differential input sample relative to a corresponding plurality of zero-crossing references. Chopping stages chop the residues, for example with a pseudo-random binary sequence. The circuit further includes zero-crossing comparators, each with differential inputs coupled to receive one of the chopped residues. The zero-crossing comparators are in an ordered sequence of zone thresholds within the input range of the circuit. Folding logic circuitry has inputs coupled to outputs of the comparators, and outputs a delay domain signal indicating a magnitude of the one of the residues relative to a nearest zone threshold. Digital stage circuitry generates a digital (Continued)

output word representing the received input sample responsive to the comparator outputs and the delay domain signal.

18 Claims, 9 Drawing Sheets

(51) Int. Cl.
  *H03M 1/50* (2006.01)
  *H03M 1/78* (2006.01)
(58) Field of Classification Search
  CPC ...... H03M 1/206; H03M 1/361; H03M 1/362; H03M 1/1004; H03M 1/1019; H03M 1/147; H03M 1/165; H03M 1/205; H03M 1/36; H03M 1/00; H03M 1/002; H03M 1/06; H03M 1/0607; H03M 1/0624; H03M 1/0678; H03M 1/0682; H03M 1/0809; H03M 1/0818; H03M 1/0836; H03M 1/089; H03M 1/1009; H03M 1/1023; H03M 1/1061; H03M 1/124; H03M 1/207; H03M 1/363; H03M 1/445; H03M 1/50; H03M 1/502
  USPC .................................. 341/155, 154, 158, 159
  See application file for complete search history.

(56) References Cited

U.S. PATENT DOCUMENTS

| | | | | |
|---|---|---|---|---|
| 6,404,374 B1* | 6/2002 | Yu | ............. | H03M 1/0646 341/159 |
| 6,445,221 B1* | 9/2002 | Poss | ............. | H03M 1/0682 326/89 |
| 6,542,107 B1* | 4/2003 | Galambos | ............. | H03M 7/165 341/172 |
| 6,570,522 B1* | 5/2003 | Galambos | ............. | H03M 1/205 341/155 |
| 6,822,600 B1* | 11/2004 | Taft | ............. | H03M 1/089 341/158 |
| 6,847,320 B1* | 1/2005 | Taft | ............. | H03M 1/0646 341/120 |
| 6,888,482 B1* | 5/2005 | Hertle | ............. | H03M 1/1014 341/120 |
| 7,071,857 B2* | 7/2006 | Bult | ............. | H03M 1/0646 341/120 |
| 7,212,144 B1* | 5/2007 | Sutardja | ............. | H03M 1/363 341/155 |
| 7,928,872 B2* | 4/2011 | Nakajima | ............. | H03M 1/1023 341/120 |
| 7,994,960 B1* | 8/2011 | Li | ............. | H03M 1/0678 341/158 |
| 10,284,188 B1 | 5/2019 | Soundararajan et al. | | |
| 10,673,452 B1 | 6/2020 | Soundararajan et al. | | |
| 10,673,456 B1 | 6/2020 | Dusad et al. | | |
| 11,309,903 B1 | 4/2022 | Miglani et al. | | |
| 11,316,525 B1 | 4/2022 | Pentakota et al. | | |
| 11,387,840 B1 | 7/2022 | Miglani et al. | | |
| 2022/0209782 A1 | 6/2022 | Rajagopal et al. | | |
| 2022/0224349 A1 | 7/2022 | Varshney et al. | | |
| 2022/0247420 A1 | 8/2022 | Rajagopal et al. | | |
| 2022/0247421 A1 | 8/2022 | Pentakota et al. | | |

OTHER PUBLICATIONS

"ADC32RF5x Dual Channel 14-bit 2.6 to 3-GSPS RF Sampling Data Converter," Datasheet SBA5500 (Texas Instruments Incorporated, Jun. 2022).

"AFE7950 4TR6 RF Sampling AFE with 12 GSPS DACs and 3 GSPS ADCs," Datasheet AFE7950 (Texas Instruments Incorporated, Mar. 2022).

Gomez, "Theoretical Comparison of Direct-Sampling Versus Heterodyne RF Receivers," Trans. Circ. Sys., vol. 63, No. 8 (IEEE, 2016), pp. 1276-1282.

Neu, "It's time for an upgrade: CMOS ADC with chopper," Blog post available at https://e2e.ti.com/blogs_/b/analogwire/posts/it-s-time-for-an-upgrade-cmos-adc-with-chopper (Texas Instruments Incorporated, 2015).

Rivandi et al., "A 6-bit 100-MS/s Fully-Digital Time-Based Analog-to-Digital Converter," 27th Iranian Conf. on Elec. Eng. (ICEE, 2019), pp. 412-415.

Roberts, "A Brief Introduction to Time-to-Digital and Digital-to-Time Converters," Trans. Circ. Sys., vol. 57, No. 3 (IEEE, 2010), pp. 153-157.

International Search Report in corresponding PCT Application No. PCT/US2023/031232, mailed Dec. 15, 2023.

Miyahara Masaya, et al: 22.6 A 2.2GS/s Tb 27.4mW Time-Based folding-flash ADC with resistively averaged voltage-to-time amplifiers (Feb. 9, 2014) pp. 388-389.

Yi IL-Min, et al: A 4-GS/s 11.3-mW 7-bit Time-Based ADC with Folding Voltage-to-Time Converter and Pipelined TDC in 65-nm CMOS (Oct. 5, 2020) pp. 465-475.

Christian C Enz, et al: Circuit Techniques for Reducing the Effects of Op-Amp Imperfections: Autozeroing, Correlated Double Sampling, and Chopper Stabilization (Sep. 1, 1996) pp. 1584-1614.

Pleog Van Der H, et al: A 3.3-v, 10-B, 25-Msample/S Two-Step ADC in 0.35-MUM CMOS (Dec. 1, 1999) pp. 1803-1811.

Machine Translation for 102009002062DE.

* cited by examiner

MULTI-BIT VOLTAGE-TO-DELAY CONVERSION IN DATA CONVERTER CIRCUITRY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This relates to data conversion circuitry, and more specifically relates to delay domain analog-to-digital converters.

Advances in the technology of wireless communications has enabled widespread deployment and new applications for such communications in recent years. Wireless communications are now commonplace in short-range communications (e.g., "personal area networks"), in wireless premises networks (e.g., home or office "WiFi" networks), and in longer-range communications (e.g., cellular networks). The performance requirements across these network types may range from low data rate and latency-tolerant applications (e.g., in machine-to-machine communication such as in the so-called "Internet of Things" or "IoT"), to high data rate, real-time applications at gigahertz frequencies.

In any of these wireless communications applications, the conversion of analog signal levels to digital data and vice versa is an important function carried out at each network node or device. The performance requirements for high data rate communications devices, particularly in mobile and battery-powered devices such as user equipment capable of "5G" cellular communications, are reflected in the performance requirements for data conversion circuitry in those devices. In these applications (especially for mobile devices), data converters may need to provide high performance (e.g., low error rate) conversion at high data rates, over wide input bandwidths, yet at low power consumption levels. Power constraints on data converters are particularly stringent in multiple-in-multiple-out (MIMO) network devices, which commonly include integrated transceivers with as many as eight or sixteen transmitters and receivers (e.g., 8T8R, 16T16R).

A common type of conventional analog-to-digital converters (ADCs) is referred to as the "pipelined" ADC. This architecture includes a first flash converter that resolves one or more most-significant bits (MSBs) of the output word from the input analog signal. A digital-to-analog converter re-converts those MSBs to an analog level that is subtracted from the original input level to generate a residual value, which is then applied to another flash converter to resolve one or more next-most MSBs, and so on. The performance of this ADC architecture is limited by the time required for the flash conversion, residue generation, and amplification of the residues (e.g., to match the input range of the next flash converter). An increase in the number of pipeline stages, for example to attain higher resolution, would further extend the overall processing time required by this architecture. An example of a pipeline ADC circuit is provided in co-pending U.S. patent application titled "METHODS AND APPARATUS TO REDUCE INTER-STAGE GAIN ERRORS IN ANALOG-TO-DIGITAL CONVERTERS" and invented by K. Prasanth and S Rahul of Texas Instruments Incorporated (T101840), which is hereby incorporated by reference in its entirety.

Recently, ADCs operating in the "delay domain" have been proposed for high performance applications. A delay domain ADC will typically include a voltage-to-delay (V2D) converter that operates to convert an input voltage level to a delay between two pulses. For example, the V2D converter may include multiple converter circuits, each receiving the analog input level and a reference level, with the reference level differing among the multiple converters. Folding interpolation logic generates signals from the converter outputs having a delay interval that indicates the proximity of the nearest reference level to the input signal. A time-to-digital converter (TDC) encodes the delay interval output from the V2D converter into a digital output word. Because the delay domain signal at the output of the V2D converter is a non-linear function of the voltage differential between the input level and the reference level, this non-linearity in the time-to-digital conversion transfer function is commonly corrected, for example by use of a look-up table (LUT). In some architectures, the LUT can be calibrated during operation, for example by periodically comparing the output data word with the conversion result from a known input level, such as from a known linear DAC, to identify the ideal input and thus any adjustment to the LUT contents.

Several sources of error have been observed in conventional delay domain analog-to-digital (A/D) conversion. Inherent differences are present between the calibration and signal paths in the V2D stage, affecting the common mode rejection ratio (CMRR) and power supply rejection ratio (PSRR). Flicker noise is also present in conventional delay domain ADCs, especially those implemented in complementary metal-oxide-semiconductor (CMOS) technology. This flicker noise can vary between calibration occurrences, which affects the non-linearity of the TDC stage, causing the spurious free dynamic range (SFDR) to vary over time. Furthermore, some implementations require two parallel TDC paths to resolve the closest of the two reference levels when the analog input level is nearly equidistant between the two levels, doubling the cost of chip area and power consumption of the TDC stage.

Some conventional delay domain ADCs use separate double differential pairs to generate each of the multiple reference levels applied in the V2D stage. However, variations in the transfer function among the differential pairs, and thus among the input range zones, can degrade the CMRR of the converter in a way that is difficult to correct via calibration. In addition, flicker noise mismatch among these differential reference pairs can result in time-dependent, and thus degraded, SFDR performance. These double differential structures also tend to be excessively noisy. Example of various V2D architectures are provided in U.S. Pat. Nos. 10,284,188 and 10,673,453, and U.S. patent application Ser. Nos. 17/126,157, 17/182,339, 17/129,180, 17/131,981, 17/158,526, 17/133,745, 17/467,561, 17/568,972, and 17/588,493 (all of which are hereby incorporated by reference in their entirety).

It is within this context that the embodiments described herein arise.

BRIEF SUMMARY OF THE INVENTION

According to one aspect, an analog-to-digital converter circuit includes a multi-bit input buffer having a differential input and configured to generate, at a plurality of differential outputs, a plurality of residues of a differential input sample relative to a corresponding plurality of zero-crossing references. The circuit further includes zero-crossing comparators, each with differential inputs coupled to receive one of the residues. The zero-crossing comparators are in an ordered sequence of zone thresholds within the input range of the circuit. Folding logic circuitry has inputs coupled to outputs of the comparators, and outputs a delay domain signal indicating a magnitude of the one of the residues relative to a nearest zone threshold. Digital stage circuitry is provided to generate a digital output word representing the received input sample responsive to the comparator outputs and the delay domain signal.

According to another aspect, a method of converting an analog signal level to a digital word includes the step of sampling a differential input signal, and generating, from that input sample, a plurality of differential residue signals relative to a plurality of zero-crossing references. The residues are applied to corresponding ones of a plurality of zero-crossing comparators in an ordered sequence according to zone threshold. An input range zone for the sampled input signal between the zone thresholds of neighboring comparators in the ordered sequence having a change in polarity at their outputs is identified, and a delay between logic transitions at the neighboring comparators is identified. The method further includes encoding a digital output word indicating the identified input range zone and the identified delay.

Technical advantages enabled by one or more of these aspects include efficient implementation of the ADC from the standpoint of chip area, and a reduction in power consumption. These aspects further enable chopping the zero-crossing residues, rather than the input signal, which can reduce the effects of additive or flicker noise in time-to-delay domain conversion. The zero-crossing comparators can be identical to one another, and produce single-ended outputs, simplifying the folding logic and eliminating the need for parallel TDC circuitry to accurately identify the input range zone.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

One or more example embodiments are described in this specification are implemented into analog-to-digital converters (ADCs), such as may be used in direct-sampling radio frequency (RF) communications receivers and transceivers, as it is contemplated that such implementation is particularly advantageous in that context. However, it is also contemplated that aspects of these embodiments may be beneficially applied in other applications incorporating analog-to-digital conversion. Accordingly, it is to be understood that the following description is provided by way of example only, and is not intended to limit the true scope of this invention as claimed.

Figure 1:
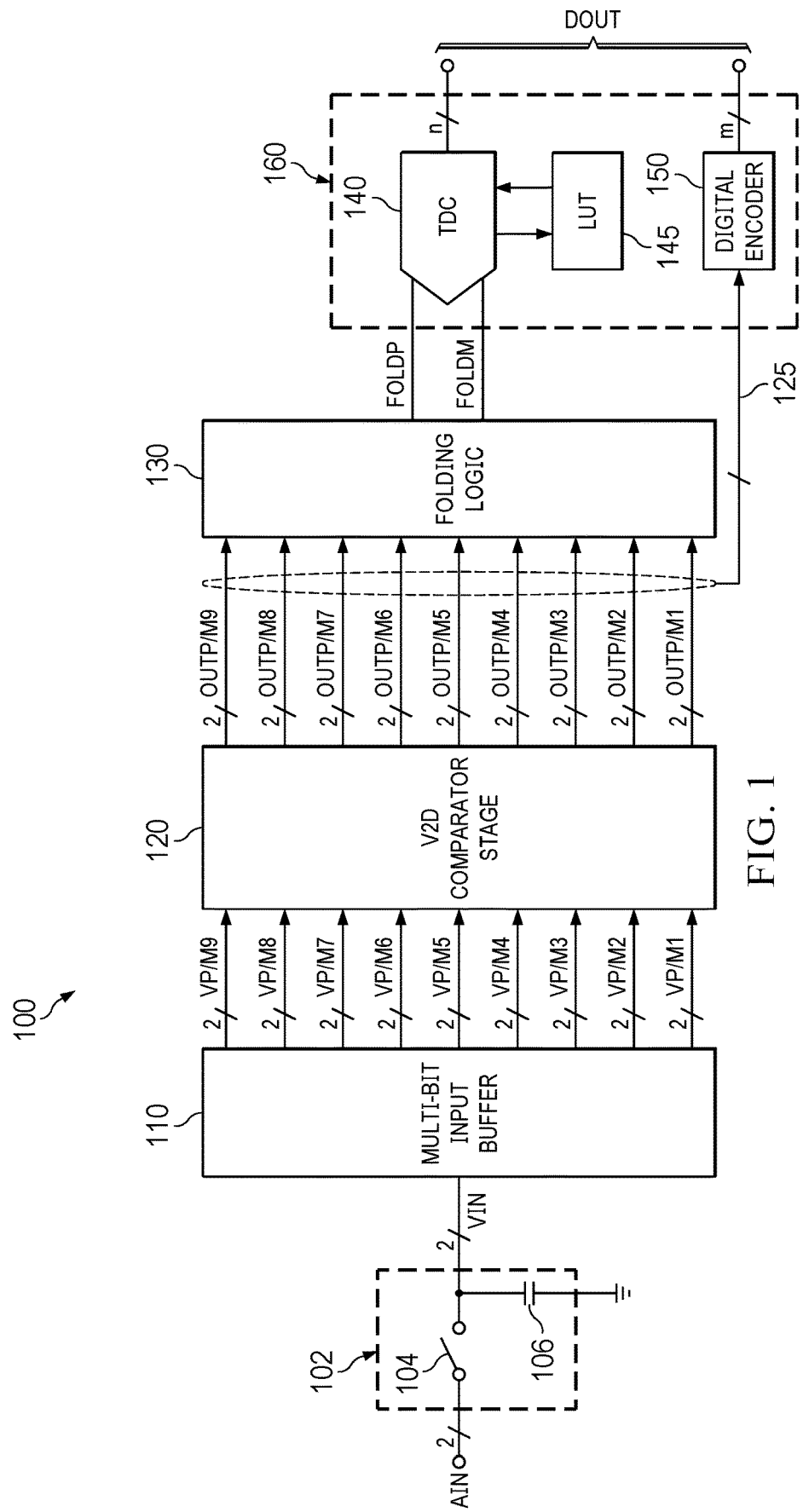
FIG. 1 is an electrical diagram, in block form, of an analog-to-digital converter according to example embodiments.

FIG. 1 illustrates the architecture of analog-to-digital converter (ADC) 100 according to example embodiments. As will be described below, ADC 100 performs analog-to-digital conversion by converting an analog voltage or current level received at its input into a delay domain signal expressed as a time interval between a pair of signal transitions, followed by conversion of the delay domain signal to a digital output word. Delay domain conversion in this manner can be well-suited for high-speed applications, such as in direct-sampling RF receivers. Examples of delay domain ADC architectures and applications are described in U.S. Pat. Nos. 10,673,452 and 10,673,456, both commonly assigned herewith and incorporated herein by this reference.

ADC 100 of FIG. 1 includes sample-and-hold circuit 102 with an input AIN receiving an analog input signal for conversion to a digital data word DOUT. Generally, the analog input signal received at input AIN may be a time-varying voltage or current, and may be in the form of a single-ended signal (e.g., communicated on a single conductor) or a differential signal (e.g., communicated on a pair of conductors or lines).

For purposes of this description and by way of example, the received analog input signal will be considered in the form of a differential voltage communicated on a pair of conductors, such that input AIN corresponds to a pair of input terminals. Sample-and-hold (S/H) circuit 102 may be constructed in the conventional manner, as appropriate for the particular application of ADC 100. In a general sense, S/H circuit 102 as shown in FIG. 1 is represented by switch 104 coupled on one side to differential input AIN and on another side to capacitor 106 at the output VIN of S/H circuit 102. (For the differential implementation as in FIG. 1, each of switch 104 and capacitor 106 is paired.) Capacitor 106 is coupled between output VIN and a common potential (e.g., circuit ground). Switch 104 is controlled by the appropriate clock circuitry (not shown) to periodically close and open at the desired sampling frequency, with each sampled voltage retained by capacitor 106 and presented at the output VIN. In this differential example, output VIN of S/H circuit 102 includes a differential pair of signal lines (e.g., INP, INM in FIG. 2) coupled to differential inputs of multi-bit input buffer 110.

Multi-bit input buffer 110 of ADC 100 according to example embodiments has an input coupled to output VIN of S/H circuit 102, and applies each input sample received from output VIN of S/H circuit 102 to a number of zero-crossing reference levels. In the example of FIG. 1, input buffer 110 has nine output pairs VP1, VM1 through VP9, VM9 (represented as outputs VP/M1 through VP/M9, respectively). Each of outputs VP/M1 through VP/M9 communicates a differential signal corresponding to a residue of the input sample relative to a corresponding zero-crossing reference level. For example, if the input signal range of ADC 100 is 500 mV p-p, output pairs VP/M1 through VP/M9 may represent the residues of the input sample relative to zero-crossing reference levels ranging in 62.5 mV steps from −250 mV to +250 mV. Output pairs VP/M1 through VP/M9 of input buffer 110 are coupled to corresponding inputs of voltage-to-delay (V2D) comparator stage 120 in the architecture of FIG. 1. Input buffer 110 may provide more or fewer output pairs than the nine shown in FIG. 1, as desired for the particular application of ADC 100.

V2D comparator stage 120, as will be described in detail below, includes a set of comparators, each receiving one of the output pairs VP/M1 through VP/M9 from input buffer 110 and generating an output logic signal based on a comparison of the levels at its inputs. In the example embodiment of FIG. 1, the individual comparators in V2D comparator stage 120 outputs complementary single-ended signals. Accordingly, V2D comparator stage 120 has nine output pairs OUTP/M1 through OUTP/M9, each presented by a corresponding comparator in response to the differential residues received on output pairs VP/M1 through VP/M9 from input buffer 110.

The logic states at output pairs OUTP/M1 through OUTP/M9 can indicate the "zone" of the input signal range within which the differential amplitude of the sampled input signal lies. For the example in which the zero-crossing reference levels applied by input buffer 110 are at 62.5 mV intervals within the input range of 500 mV p-p, the logic levels of the complementary outputs OUTP/M1 through OUTP/M9 indicate the zone of the input range, for example by way of a thermometer code. Accordingly, the zero-crossing references applied by input buffer 110 define the zone thresholds of the corresponding comparators in V2D comparator stage 120. Outputs OUTP/M1 through OUTP/M9 are coupled via signal lines 125 to digital encoder 150 in digital stage 160, for the encoding of m bits of digital output word DOUT according to the indicated zone.

In addition to indicating the zone in which the input differential voltage lies, individual comparators in stage 120 provide an indication, in the delay domain, of the proximity of the input sample to the corresponding zone threshold, based on the response time of that comparator to the magnitude of the residue at its input. A residue having a relatively large differential magnitude, indicating that the input sample has a large difference relative to the associated zero-crossing reference (or zone threshold), will be reflected in rapid switching at the comparator output. Conversely, the comparator output will respond slowly to a residue of small magnitude, indicating that the input sample is close to the corresponding zero-crossing reference level (or zone threshold).

According to the architecture of FIG. 1, some of the outputs OUTP/M1 through OUTP/M9 of V2D comparator stage 120 are coupled to inputs of folding logic 130. As will be described in further detail below, folding logic 130 includes digital logic gates arranged to generate logic transitions at its outputs FOLDP, FOLDM having a relative delay corresponding to the amplitude difference between the input sample and the nearest zone threshold. Outputs FOLDP, FOLDM of folding logic 130 are coupled to time-to-digital converter (TDC) 140 in digital stage 160, which operates to encode n bits of digital output word DOUT in response to the delay between the logic transitions at folding logic outputs FOLDP, FOLDM and to which transition leads the other (i.e., the polarity of the delay). Look-up table (LUT) 145 may be included in or with digital stage 160, to receive a digital address from TDC 140 based on the delay observed at outputs FOLDP, FOLDM, and to forward corrected digital data back to TDC 140 or directly forward the corrected digital data as n bits of word DOUT, in either case corrected for non-linearity in the voltage-to-digital conversion. LUT 145 may be constructed as an addressable memory such as random access memory (RAM) or another type of writable memory, with an address input coupled to receive a digital address from TDC 140 and a data output presenting the corrected digital data.

For example, the most significant bits (MSBs) of digital output word DOUT may be the m bits encoded by digital encoder 150 to indicate the input range zone of the input sample, while the n least significant bits of digital word DOUT may be those output by TDC 140 in response to the relative delay at folding logic outputs FOLDP, FOLDM. Alternatively, digital stage 160 may encode digital output word DOUT according to a different coding scheme as appropriate for the application.

Figure 2:
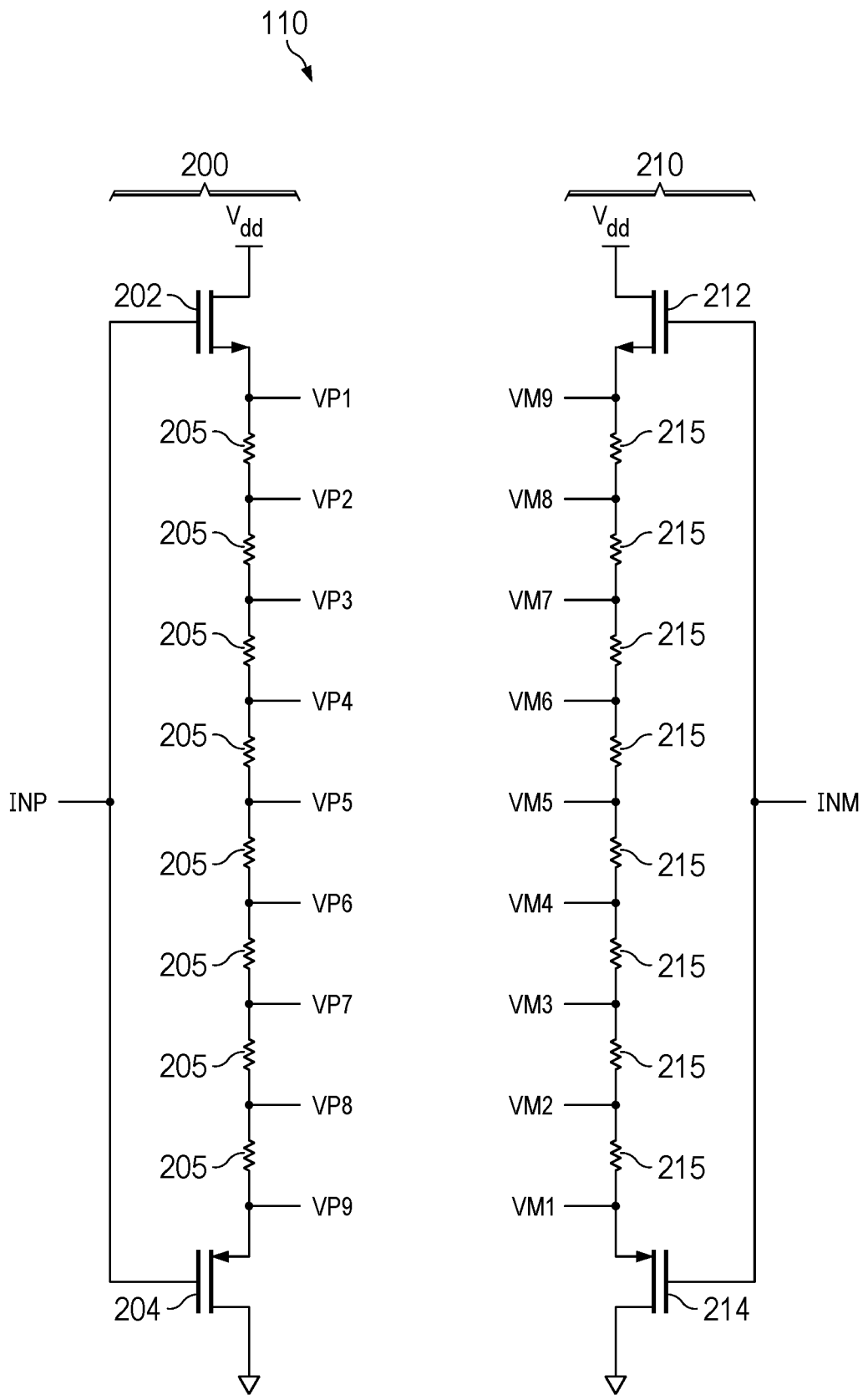
FIG. 2 is an electrical diagram, in schematic form, of a multi-bit input buffer in the analog-to-digital converter of FIG. 1 according to example embodiments.

FIG. 2 illustrates the construction of multi-bit input buffer 110 according to an example embodiment. In this example in which a differential input sample is received at inputs INP, INM, input buffer 110 includes a pair of resistor ladders 200, 210, each biased between power supply node $V_{dd}$ and circuit ground, and receiving differential inputs INP, INM, respectively, from output VIN of S/H circuit 102.

Resistor ladder 200 includes n-channel metal oxide semiconductor (NMOS) transistor 202 with its drain at power supply node $V_{dd}$ and its source coupled to a resistor 205 at node VP1. Resistor ladder 200 also includes p-channel MOS (PMOS) transistor 204 with its drain at circuit ground and its source coupled to a resistor 205 at node VP9. In this example, eight resistors 205 are connected in series between the source of NMOS transistor 202 at node VP1 and the source of PMOS transistor 204 at node VP9. It is convenient for resistors 205 to have the same resistance values as one another to define equally sized differential voltage intervals, or "zones" of the ADC input range. However, in other examples, some or all of resistors 205 may have different resistances. The junction between each of resistors 205 in resistor ladder 200 presents a corresponding node VP2 through VP8 (from top to bottom in FIG. 2). Input INP is coupled to the gates of transistors 202 and 204.

Resistor ladder 210 is similarly constructed as resistor ladder 200, with NMOS transistor 212 having a drain at power supply node $V_{dd}$ and its source coupled to a resistor 215 at node VM9, and PMOS transistor 214 with its drain at circuit ground and its source coupled to a resistor 215 at node VM1. Eight resistors 215 are connected in series between the source of NMOS transistor 212 at node VM9 and the source of PMOS transistor 214 at node VM1. Resistors 215 may have the same resistance values as one another and as resistors 205 in resistor ladder 200, again to define equally sized differential voltage zones. Nodes VM8 through VM2 are present at the junctions between resistors 215 of resistor ladder 210, in the reverse order (from top to bottom in FIG. 2) from that of resistor ladder 200. Input INM is coupled to the gates of transistors 212 and 214.

Resistors 205, 215 may be constructed as diffused, polysilicon, or other patterned resistors, depending on the integrated circuit technology used to fabricate an integrated circuit including ADC 100. Alternatively, resistors 205, 215 may be constructed as MOS transistors with gates biased into the ohmic region at the desired resistance level. In addition, more or fewer resistors 205, 215 may be provided in resistor ladders 200, 210, respectively, than the eight in this example, defining more or fewer node pairs accordingly.

The current conducted between power supply node $V_{dd}$ and circuit ground through resistor ladders 200, 210 remains relatively constant regardless of the differential voltage at inputs INP, INM, so long as the voltage at each input is sufficient to bias transistors 202, 204, 212, 214 into the linear region. As the differential voltage at inputs INP, INM varies, the voltages at nodes VP1 through VP9 and VM1 through VM9 will vary accordingly. Referring first to resistor ladder 200, a higher voltage at input INP will tend to turn on transistor 202 more strongly, decreasing its drain-source resistance, and turn on transistor 204 less strongly, increasing its drain-source resistance. Accordingly, the voltages at nodes VP1 through VP9 will increase with increasing voltage at input INP. Resistor ladder 210 operates in the same manner, again with the order of nodes VM9 through VM1 reversed, from top to bottom (FIG. 2), from that of resistor ladder 200.

Accordingly, input buffer 110 operates to present a set of differential output voltages at paired nodes VP1 and VM1 (referred to as VP/M1); VP2 and VM2 (VP/M2); . . . ; and VP9 and VM9 (VP/M9) in response to the differential voltage at inputs INP, INM (the input sample). Each node pair VP/M1 through VP/M9 presents a differential voltage based on the input sample at a different offset. For example, if the input sample is a zero differential voltage across inputs INP, INM, the differential voltage across nodes VP5 and VM5 will be approximately zero, since these two nodes VP5 and VM5 are in the center of their respective resistor ladders 200, 210. At this zero input differential voltage, the on resistance of resistors 202, 212 match one another and the on resistance of resistors 204, 214 match one another. In other words, the zero-crossing reference applied at nodes VP5 and VM5 is 0 mV.

On the other hand, a zero differential voltage at inputs INP, INM will cause a positive differential voltage to appear across nodes VP4 and VM4, according to an offset voltage defined by their different positions within their respective resistor ladders 200, 210 (node VP4 being two resistor values closer to $V_{dd}$ than node VM4). Positive offset voltages similarly appear across node pairs VP/M3, VP/M2, VP/M1, with increasing magnitude in that order. In similar fashion, a negative differential voltage will appear across nodes VP6 and VM6 for a zero input differential voltage, because node VP6 is two resistor values closer to circuit ground than node VM6. Negative offset voltages similarly appear across node pairs VP/M7, VP/M8, and VP/M9, with increasing magnitude in that order. Accordingly, the offsets applied at the node pairs VP/M1 through VP/M9 are ordered from positive to negative in this example.

Conversely, a non-zero differential input sample at inputs INP, INM will cause one of the node pairs other than center nodes VP/M5 to exhibit the lowest output differential voltage. For example, if a positive differential voltage is present across inputs INP, INM, the voltages at nodes VP1 through VP9 will be higher than the opposing nodes VM9 through VM1, respectively, since NMOS transistor 202 will have a lower on resistance than NMOS transistor 212 (and PMOS transistor 204 will have a higher on resistance than PMOS transistor 214). One of the node pairs VP/M1 through VP/M4 may in this case present the smallest output differential voltage, according to the magnitude of the input sample differential voltage.

Accordingly, the differential offset voltages at the node pairs VP/M1 through VP/M9 of input buffer 110 serve as zero-crossing references against which the input differential voltage is compared. The differential voltage appearing at each of node pairs VP/M1 through VP/M9 is thus a residue of the input sample received at inputs INP, INM relative to the corresponding zero-crossing reference at that node pair.

An example of this operation of input buffer 110 will be instructive. Consider a differential voltage received by ADC 100 at input AIN, and sampled by S/H circuit 102, with a differential swing of 500 mV peak-to-peak. Samples of the differential voltage across inputs INP, INM can thus vary between −250 mV and +250 mV. For converting such a 500 mV analog differential signal, input buffer 110 (according to one example) includes resistor ladders 200, 210, each with eight resistors 205, 215 of resistances selected to apply a zero-crossing reference at each of node pairs VP/M1 through VP/M9 as listed in Table 1:

TABLE 1

| Node pair | Zero-crossing reference |
|---|---|
| VP9-VM9 | +250 mV |
| VP8-VM8 | +187.5 mV |
| VP7-VM7 | +125 mV |
| VP6-VM6 | +62.5 mV |
| VP5-VM5 | 0 mV |
| VP4-VM4 | −62.5 mV |
| VP3-VM3 | −125 mV |
| VP2-VM2 | −187.5 mV |
| VP1-VM1 | −250 mV |

According to this Table 1, input buffer 110 generates residues of the differential sample signal at inputs INP, INM versus nine zero-crossing references varying from −250 mV to +250 mV in 62.5 mV steps. For example, if the sampled differential voltage at inputs INP, INM is +62 mV, nodes VP/M9 will present a differential residue of −188 mV, nodes VP/M8 will present a −125.5 mV differential residue, nodes VP/M7 will present a −63 mV differential residue, and so on, to nodes VP/M1 presenting a +312 mV differential residue. In this example, the lowest magnitude residue of the set will be −0.5 mV at nodes VP6 and VM6.

According to this example, the input range zone in which the differential voltage at inputs INP, INM lies can be identified from the polarities of the differential voltages at nodes VP/M1 through VP/M9 of input buffer 110. Specifically, the neighboring node pairs exhibiting residues of opposite polarity indicates the zone of the input sample. For the example above of an input differential voltage of +62 mV, the output voltage at nodes VP/M6 is −0.5 mV as noted above, while the output voltage at nodes VP/M5 is +62 mV (the zero-crossing reference at nodes VP/M5 is 0 mV). Accordingly, the input differential voltage lies in the zone between 0 mV (VP/M5) and +62.5 mV (VP/M6).

Figure 3A:
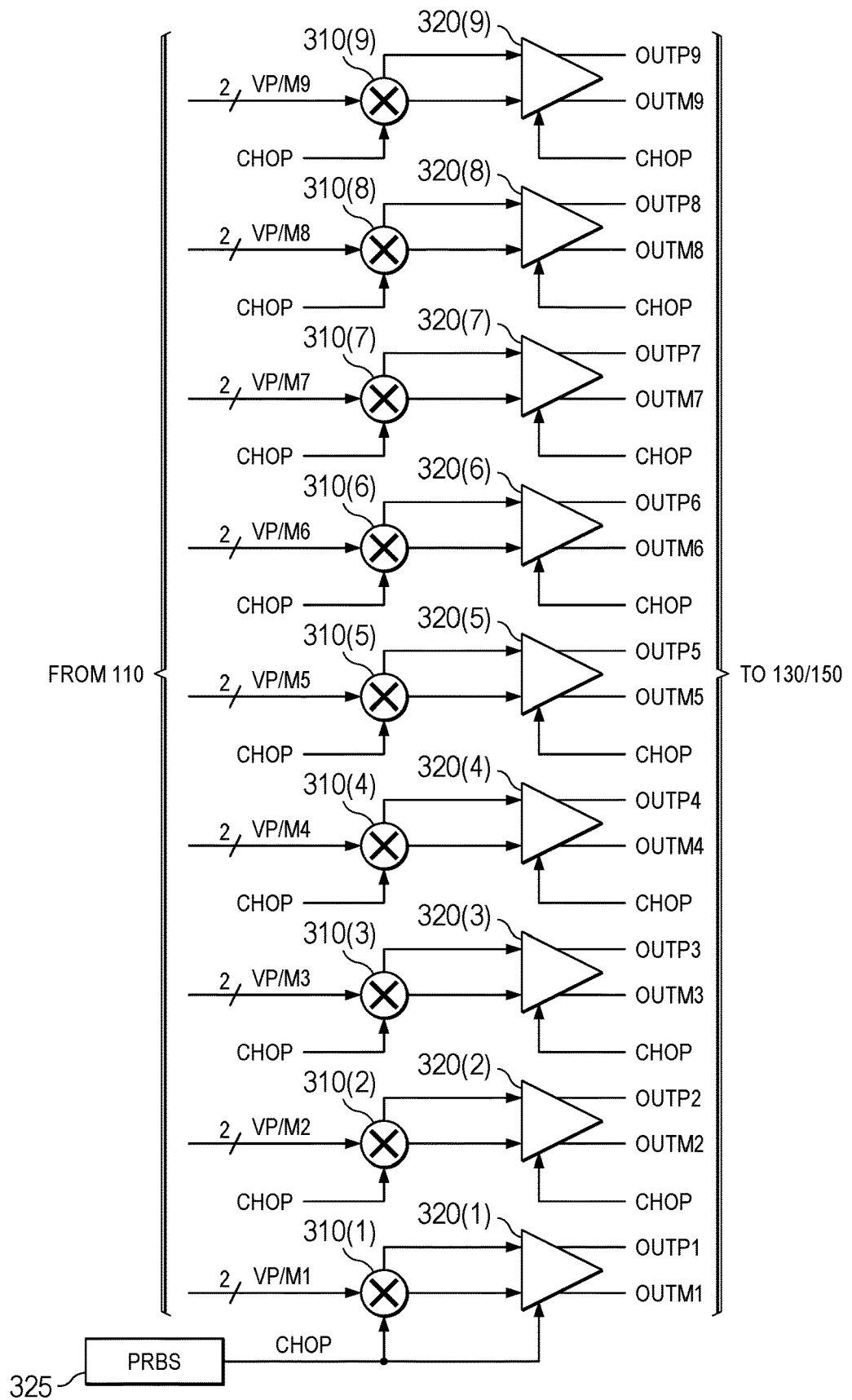
FIG. 3A is an electrical diagram, in block form, of a voltage-to-delay converter stage in the analog-to-digital converter of FIG. 1 according to example embodiments.

Referring back to FIG. 1, the output differential voltages at node pairs VP/M1 through VP/M9 of input buffer 110 are applied to corresponding inputs of V2D comparator stage 120. FIG. 3A illustrates an architecture of V2D comparator stage 120 according to this example embodiment, as will now be described. According to this example embodiment, V2D comparator stage 120 includes, for each node pair of input buffer 110, a chopping stage followed by a comparator stage.

Chopping of a signal refers to the mixing of an input signal with a time-varying signal to shift the frequency of the input signal, for example to a frequency less vulnerable to noise. In high-speed data conversion, such as may be performed by ADC 100 in certain applications, the effects of flicker noise can degrade the resolution and accuracy of the conversion and reduce the effectiveness of calibration on non-linearities inherent in the delay domain conversion. For flicker noise having a 1/f frequency characteristic, as is common in MOS circuitry such as comparator circuits, chopping of a baseband signal can shift its bandwidth to a higher frequency, which can reduce the effect of flicker noise on the processed signal.

According to this example embodiment as shown in FIG. 3A, each node pair VP/M1 through VP/M9 is coupled to corresponding inputs of chopping stages 310(1) through 310(9), respectively (referred to generically or cumulatively herein as chopping stages 310). Chopping stages 310 may be constructed as passive or active mixers, or in such other conventional manner for mixing the residues with a chopping signal. In this implementation, pseudo-random binary sequence (PRBS) logic 325 generates a chopping signal CHOP applied to each of chopping stages 310 in the form of a pseudo-random binary sequence (e.g., multiplication with a random sequence of binary values +1 and −1) at a frequency at or below one-half the sampling frequency $f_s$ of S/H circuit 102 (i.e., at or below the Nyquist frequency of the signal being converted). It has been observed that use of a PRBS sequence as chopping signal CHOP avoids causing a "spur" in the signal spectrum. To apply a PRBS as the chopping signal, chopping stages 310 may be constructed of logic or other circuitry that selectively inverts the differential residues according to the PRBS value as generated by PRBS logic 325 as chopping signal CHOP, for presentation at corresponding outputs. The differential outputs of chopping stages 310(1) through 310(9) are coupled to differential inputs of comparators 320(1) through 320(9), respectively, as shown in FIG. 3A.

V2D comparator stage 120 also includes comparators 320(1) through 320(9) (referred to generically or cumulatively herein as comparators 320), each having a differential input coupled to receive the residues at corresponding node pairs VP/M1 through VP/M9 from input buffer 110, as chopped by chopping stages 310(1) through 310(9), respectively. Comparators 320 can be considered to be in an ordered sequence in V2D comparator stage 120, according to the zero-crossing reference for the residue received at the comparator inputs. In this example, comparators 320 are constructed and configured as zero-crossing comparators, each with complementary single-ended outputs. For example, as shown in FIG. 3A, comparator 320(1) has a positive output OUTP1 and negative output OUTM1, comparator 320(2) has a positive output OUTP2 and negative output OUTM2, and so on. Alternatively, each comparator 320 may have only a single output (e.g., the positive output OUTP1 for comparator 320(1)), with a separate inverter or other downstream logic provided to generate the logical complement of the level at that single output if needed. Also in this example, comparators 320 each also have an input receiving chopping signal CHOP from PRBS logic 325, in response to which comparators 320 selectively invert their results according to the PRBS value generated by PRBS logic 325 as chopping signal CHOP. In this manner, any inverting applied by chopping stages 310 is reversed at comparators 320, such that the outputs of comparators 320 reflect the polarity of the differential residues from input buffer 110 at their corresponding inputs.

Accordingly, in this example, each comparator 320 generates a logic high level at its positive output (e.g., OUTP1 for comparator 320(1)) and a logic low level at its negative output (e.g., OUTM1) in response to the corresponding differential residue from input buffer 110 having a positive polarity, and generates a logic low level at its positive output and a logic high level at its negative input in response to the corresponding differential residue having a negative polarity. The logic states at the outputs of comparators 320 provide an indication of the input range zone in which the input sample lies.

For the example of an input differential voltage of +62 mV as described above, resulting in differential residues of +62 mV at nodes VP/M5 and −0.5 mV at nodes VP/M6, comparator 320(5) will drive a high level at its output OUTP5 and a low level at its output OUTM5, and comparator 320(6) will drive a low level at its output OUTP6 and a high level at its OUTM6. Because of the change in output polarity between comparator 320(5) and its neighboring comparator 320(6), those comparators 320(5) and 320(6) can be considered as the "critical" comparators in this example, as they identify the zone in which the input sample lies. For this example, comparators 320(1) through 320(4) below comparator 320(5) in the ordered sequence of comparators 320 will all drive a high logic level at their positive outputs and a low logic level at their negative outputs, as the polarity of the corresponding residues from input buffer 110 applied to those comparators will all be positive. Conversely, comparators 320(7) through 320(9) above comparator 320(6) in the ordered sequence of comparators 320 will all drive a low logic level at their positive outputs and a high logic level at their negative outputs, as the polarity of the corresponding residues from input buffer 110 applied to those comparators will all be negative. The outputs of comparators 320, considered as an ordered sequence, thus provide a thermometer coded digital value indicating the voltage zone in which the differential voltage at inputs INP, INM lies. According to the architecture of ADC 100 of FIG. 1, the outputs of comparators 320 are forwarded via signal lines 125 to digital encoder 150 in digital stage 160. Digital encoder 150 encodes m bits of digital output word DOUT in response to the outputs of comparators 320, with those m bits indicating the voltage zone of the sampled input signal, for example as the m most significant bits of output digital word DOUT.

In addition to the logic levels output at the complementary single-ended outputs of comparators 320, comparators 320 also operate to convert the magnitude of the differential signal at their inputs into the delay domain. As conventional in zero-crossing comparators, comparators 320 respond more rapidly to larger differential input voltages than to smaller differential input voltages. One can characterize the delay domain response of a zero-crossing comparator such as a comparator 320 in this example to the difference of its two input voltages $V_{in+}$, $V_{in-}$ as:

$$t_{delay} = \tau \cdot \ln(V_{in+} - V_{in-}) \quad (1)$$

wherein $t_{delay}$ is the response time of a logic transition at the comparator output, and $\tau$ is a proportionality constant defined by circuit parameters. In the example embodiment of FIG. 3A, the input voltage difference $[(V_{in+})-(V_{in-})]$ corresponds to the differential residue received at the inputs of each comparator 320. This differential voltage for each comparator 320 is the differential residue from the corresponding nodes of resistor ladders 200, 210 of input buffer 110 (as chopped by the associated chopping stage 310). The smaller the residue, the slower the response by comparator 320, such that the delay at the output of each comparator 320 is a measure of the magnitude of the differential residue at its inputs.

As shown in FIG. 3A and described above, chopping stages 310 apply the chopping signal CHOP to the residues at each of node pairs VP/M1 through VP/M9 from input buffer 110. It has been observed, in connection with these example embodiments, that this chopping of residues applied by V2D comparator stage 120 as shown in FIG. 3A substantially reduces the effects of flicker noise and other additive noise, as compared with conventional chopping of the input signal itself. In addition, the chopping of residues according to this example embodiment also reduces error in the conversion result due to differences among comparators 320, as will now be described relative to FIG. 3B through FIG. 3E.

Figure 3B:
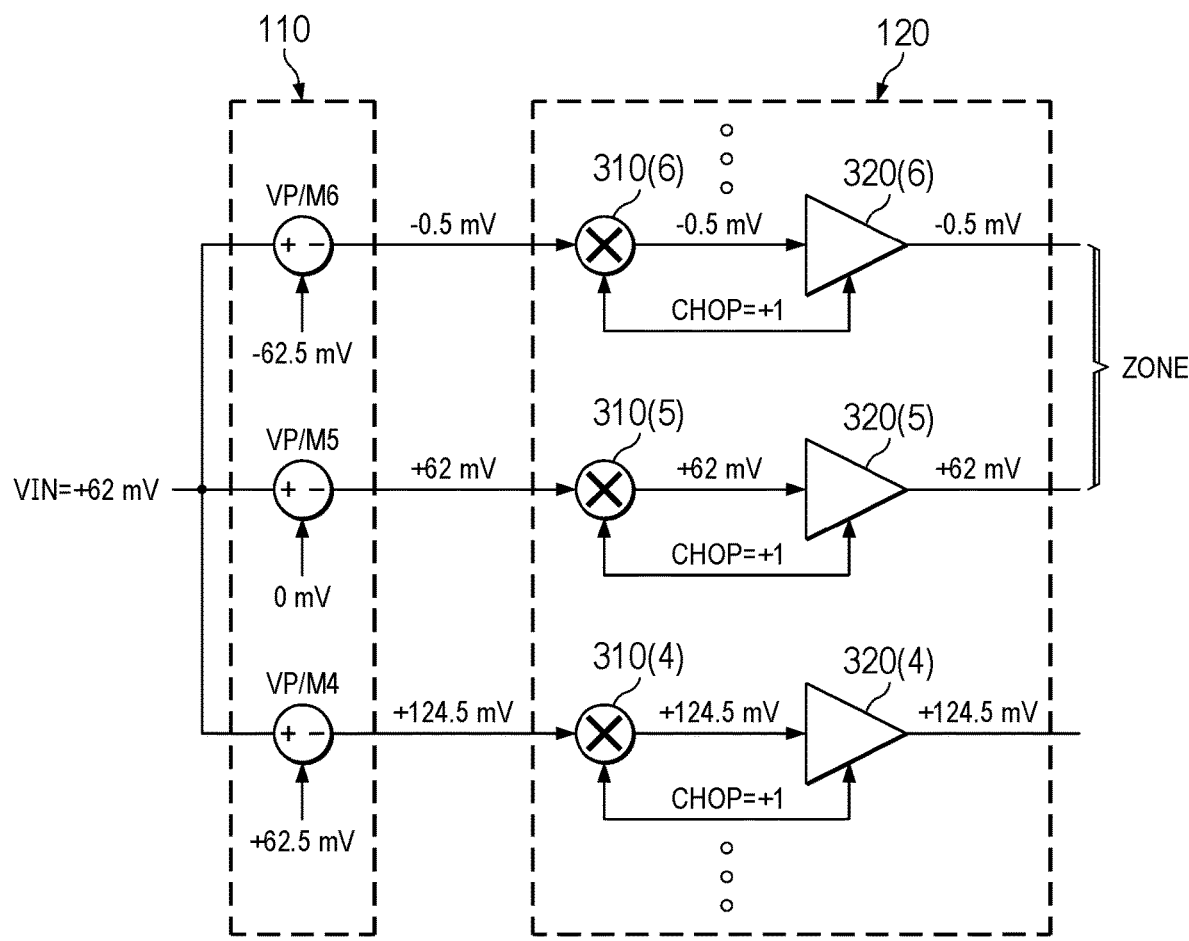
FIG. 3B and FIG. 3C are electrical diagrams, in block form, illustrating an example of frequency chopping in the voltage-to-delay converter stage of FIG. 3A according to example embodiments.
Figure 3C:
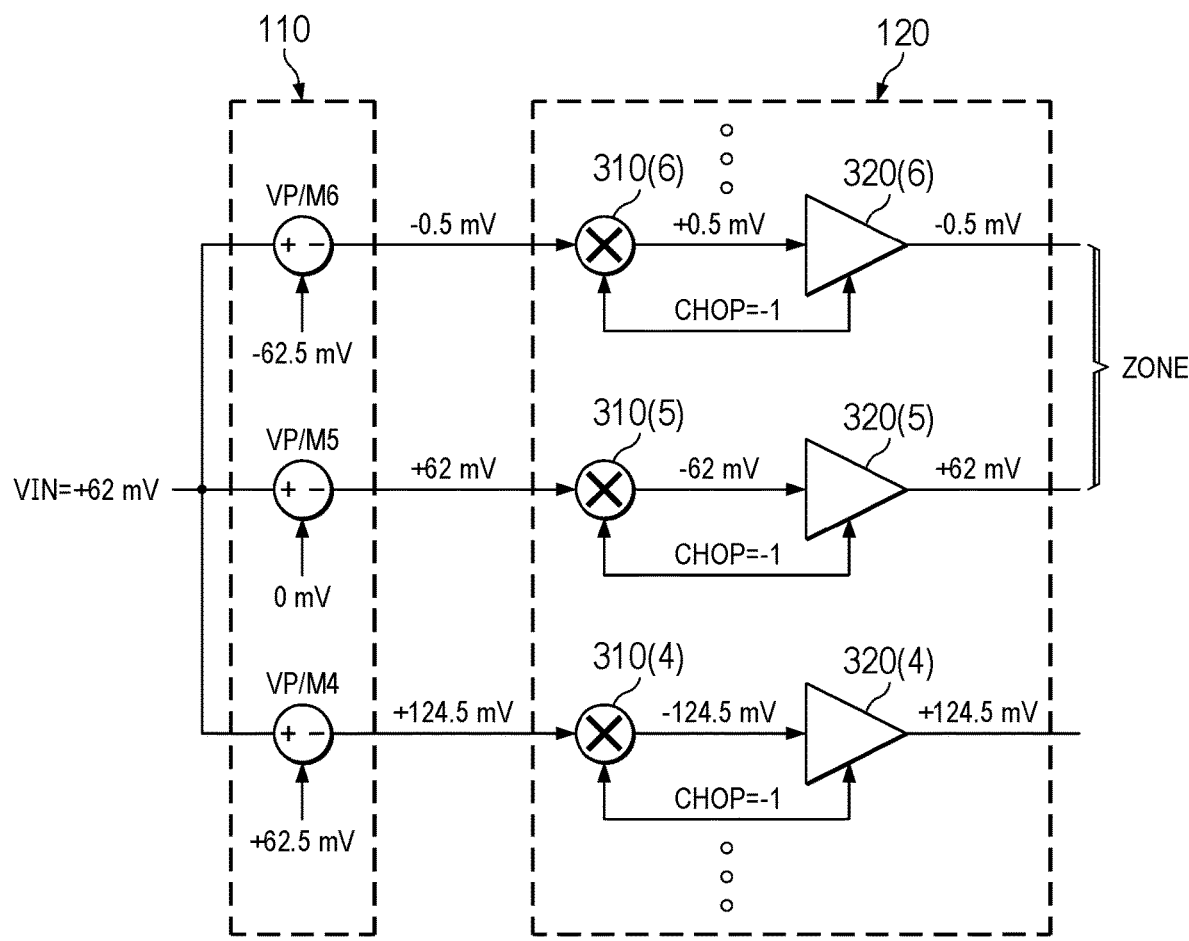

FIG. 3B and FIG. 3C illustrate an example of the operation of input buffer 110 and V2D comparator stage 120 according to the example of FIG. 3A, for the case of a sampled input differential voltage VIN of +62 mV. As shown in Table 1, node pairs VP/M6, VP/M5, and VP/M4 are most relevant for this example, and produce residues of the input sample VIN relative to zero-crossing references of −62.5 mV, 0 mV, and +62.5 mV, respectively. The resulting differential residues applied to V2D comparator stage 120 from node pairs VP/M6, VP/M5, and VP/M4 are thus −0.5 mV, +62 mV, and +124.5 mV, respectively.

FIG. 3B illustrates the operation of chopping stages 310(6), 310(5), 310(4) as applying a +1 value of chopping signal CHOP to the differential residues received from node pairs VP/M6, VP/M5, and VP/M4, respectively. The +1 level of chopping signal CHOP at chopping stages 310 operates to pass the residue, without change, to the differential inputs of corresponding comparators 320. In this example, comparators 320 present single-ended signals (in complementary levels, in this example) indicating the polarity of the differential voltage at their inputs, after a delay corresponding to the magnitude of that differential voltage, as described above. Comparators 320 apply the current level of chopping signal CHOP at their outputs by either inverting or not inverting the result of the comparison. For the +1 level of chopping signal CHOP in the example of FIG. 3B, the output of comparators 320 is not inverted. Accordingly in this example, comparator 320(6) issues a negative polarity output at a delay corresponding to the differential voltage of −0.5 mV, and comparators 320(5) and 320(4) issue positive polarity outputs at delays corresponding to the differential voltages of +62 mV and +124.5 mV, respectively. For purposes of identifying the input range zone in which input voltage VIN lies, the negative result from comparator 320(6) and the positive result from its neighboring comparator 320(5) (e.g., the critical comparators in this example) indicate that the input voltage VIN lies in the input range zone between 0 mV and +62.5 mV, which are the zone thresholds corresponding to comparators 320(5) and 320(6), respectively.

FIG. 3C illustrates the same operation for the case in which chopping signal CHOP is at a −1 level. As such, the differential residues of −0.5 mV, +62 mV, and +124.5 mV, at node pairs VP/M6, VP/M5, and VP/M4 are inverted by respective chopping stages 310(6), 310(5), and 310(4). Comparator 320(6) thus receives a differential voltage of +0.5 mV at its input from chopping stage 310(6), comparator 320(5) receives −62 mV at its input from chopping stage 310(5), and comparator 320(4) receives −124.5 mV at its input from chopping stage 310(4). Comparators 320 operate as in the case of FIG. 3B, but inverting the result in response to chopping signal CHOP at its −1 level. As shown in FIG. 3C, the resulting signals output from comparators 320(6), 320(5), and 320(4) are the same for the −1 chopping level as for the +1 chopping level, with comparators 320(5) and 320(6) being the critical comparators identifying the input range zone of the input sample between the zone thresholds of 0 mV and 62.5 mV.

As evident from the example shown in FIG. 3B and FIG. 3C, the same two comparators 320(6) and 320(5) are the critical comparators 320 for both chopping signal levels. Because of this, any flicker or other additive noise at comparators 320 will tend to cancel out over time, as such noise that is present at the +1 chopping level will be reversed in polarity at the −1 chopping level. This cancellation effect is due to chopping stages 310 operating on each of the residues from input buffer 310, rather than being applied to the input signal VIN prior to input buffer 110 ahead of comparison of the input signal to generated reference voltages, as is performed in conventional delay domain ADCs. It has been observed from conventional architectures that chopping applied to the input signal, rather than to residues as in the example of FIGS. 3A through 3C, could cause the critical comparators to be different for the different chopping levels, in that one input range zone may be indicated for the case of a +1 chopping signal level while a different input range zone may be indicated (by at least one different critical comparator, for example) for the −1 chopping signal level. While the correct zone can be determined by downstream logic circuitry, the different critical comparators involved in the zone identification inherently have differences that may affect flicker noise, with the effect of those differences not cancelling out between the two chopping signal levels.

According to example embodiments, therefore, the chopping of residues rather than the input signal improves conversion accuracy, providing additional robustness of ADC 100 to flicker noise.

In addition, the construction of input buffer 110 as described above to generate the residues at node pairs VP/M1 through VP/M9 in this example enables V2D comparator stage 120 to be configured as a set of zero-crossing comparators 320 constructed identically relative to one another. By using identical comparators 320 for converting the residues to the delay domain, superior common mode rejection ratio (CMRR) performance can be attained, since mismatch due to design differences in the comparator circuit parameters can be avoided. In addition, resistor ladders 200, 210 in input buffer 110 enable the bandwidth at each zone threshold (zero-crossing reference) to be similar, at least to the first order. Improvement in the overall bandwidth and thus performance of ADC 100 can be attained as a result. The resistor structure construction of input buffer 110 can also reduce the flicker at the thresholds, in that current noise tends to spill predominantly into the fundamental frequency of the signal.

Referring back to FIG. 1, output pairs OUTP/M1 (e.g., output pair OUTP1 and OUTM1) through OUTP/M9 (e.g., output pair OUTP9 and OUTM9) may be forwarded to digital encoder 150 via signal lines 125, for encoding of m bits of digital output word DOUT. As noted above in this example, the logic states of output pairs OUTP/M1 through OUTP/M9 provide a thermometer encoded indication of the input range zone in which the sampled input differential voltage lies. It is of course understood that the zone indication may be made from only the positive comparator outputs OUTP1 through OUTP9, or for that matter only from the negative comparator outputs OUTM1 through OUTM9.

According to this example embodiment, some or all of comparator outputs OUTP1 through OUTP9 and OUTM1 through OUTM9 are also forwarded to folding logic 130, for generation of a delay domain signal corresponding to the residue of the input sample relative to its closest zone threshold. More specifically, folding logic 130 (according to this implementation) is configured to present logic transitions at two outputs FOLDP, FOLDM, with the delay interval between those transitions constituting the delay domain signal indicating the differential of the residue from the closest zone threshold.

Figure 4A:
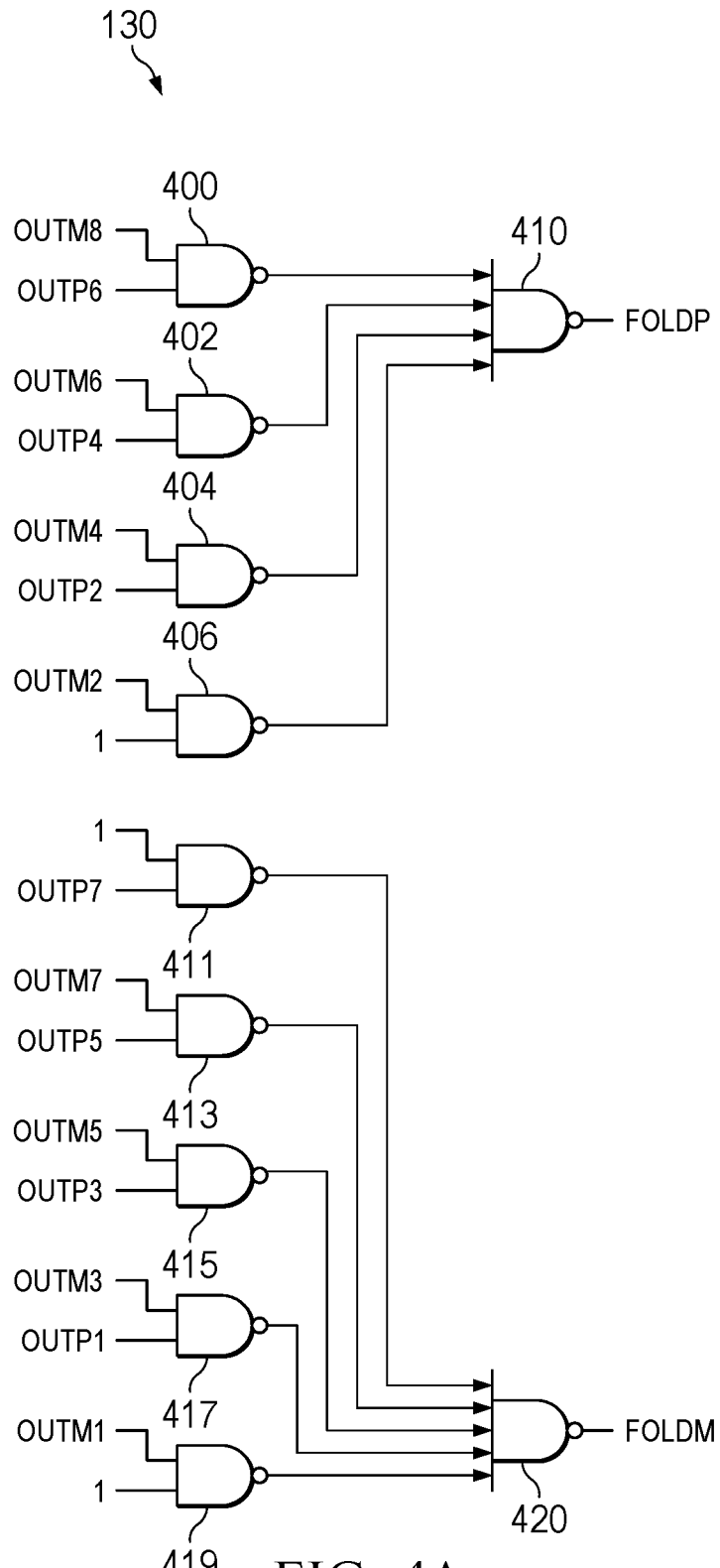
FIG. 4A is an electrical diagram, in schematic form, of folding logic in the analog-to-digital converter of FIG. 1 according to example embodiments.

FIG. 4A illustrates an example of the construction of folding logic 130 according to this example embodiment. NAND gate 400 in folding logic 130 has an input coupled to output OUTM8 of comparator 320(8) of V2D stage 120 and an input coupled to output OUTP6 of comparator 320(6). Similarly, NAND gate 402 has an input coupled to output OUTM6 of comparator 320(6) and an input coupled to output OUTP4 of comparator 320(6), and NAND gate 404 has an input coupled to output OUTM4 of comparator 320(4) and an input coupled to output OUTP2 of comparator 320(2). NAND gate 406 has an input coupled to output OUTM2 of comparator 320(2) and an input coupled to a voltage corresponding to a logic high or "1" level (e.g., at the $V_{dd}$ power supply). Each of NAND gates 400, 402, 404, and 406 have an output coupled to a corresponding input of NAND gate 410, and NAND gate 410 has an output FOLDP.

NAND gate 411 has an input coupled to output OUTM9 of comparator 320(9) and an input coupled to output OUTP7 of comparator 320(7) of V2D stage 120, NAND gate 413 has an input coupled to output OUTM7 of comparator 320(7) and an input coupled to output OUTP5 of comparator 320(5), NAND gate 415 has an input coupled to output OUTM5 of comparator 320(5) and an input coupled to output OUTP3 of comparator 320(3), and NAND gate 417 has an input coupled to output OUTM3 of comparator 320(3) and an input coupled to output OUTP1 of comparator 320(1). NAND gate 419 has an input coupled to output OUTM1 of comparator 320(1) and an input coupled to a voltage corresponding to a logic "1" level. Each of NAND gates 411, 413, 415, 417, and 419 have an output coupled to a corresponding input of NAND gate 420, which has an output FOLDM.

While folding logic 130 according to this example is implemented using NAND logic, it is understood that other types of logic and logic gates may alternatively be used to equivalently carry out the same logic operation as the NAND logic in this example, with the appropriate polarity input signals selected accordingly.

NAND gates 400, 402, 404, and 406 in this example are thus arranged to receive a negative input (e.g., OUTM8) from one even-numbered comparator 320, and a positive input (e.g., OUTP6) from the next lower even-numbered comparator 320 in order in V2D comparator stage 120, which is two zone thresholds away. In this arrangement, the fixed "1" level at an input of NAND gate 406 thus essentially corresponds to the lowest amplitude in the input range of ADC 100, which the sampled input differential voltage VIN is necessarily above. According to this arrangement of NAND gates 400, 402, 404, 406, the output of the even-numbered critical comparator 320 for a given input sample will be delayed relative to the other outputs, as the residue received at that comparator will be the smallest among the even-numbered comparators.

For the example described above relative to Table 1, NAND gate 400 presents a logic "0" level at its output if the sampled input differential voltage is between the zone threshold of comparator 320(8) (e.g., +187.5 mV) and the zone threshold of comparator 320(6) (e.g., +62.5 mV), as that condition would result in both of outputs OUTM8 and OUTP6 being at a "1" level. NAND gates 402, 404, 406 similarly respond to whether the sampled input differential voltage VIN lies between the thresholds of the comparators 320 driving their inputs. It will be apparent that the output of only the one of NAND gates 400, 402, 404, 406 coupled to the even-numbered critical comparator 320 will be at a "0" level for a given input sample. In addition, the delay of the output logic transition to the "0" level of that one of NAND gates 400, 402, 404, 406 will be inversely indicative of the differential between the residue voltage and the nearest zone threshold among the even-numbered comparators 320.

NAND gate 410 has inputs coupled to the outputs of NAND gates 400, 402, 404, 406 as shown in FIG. 4A, and operates to produce a single output signal at output FOLDP for the smallest even-numbered residue. Because the output of only one of NAND gates 400, 402, 404, 406 transitions from a "1" level to a "0" level for a given input sample while the others maintain at a "1" output level for that sample, output FOLDP of NAND gate 410 will make a "0" to "1" transition in response to the "1" to "0" transition of that one NAND gate. The delay of the output logic transition to the "1" at output FOLDP will be inversely indicative of the differential between the residue voltage and the nearest zone threshold among the even-numbered comparators 320 in V2D comparators stage 120.

Similarly, NAND gates 411, 413, 415, 417, and 419 in this example are arranged to receive a negative input (e.g., OUTM9) from one odd-numbered comparator 320, and a positive input (e.g., OUTP7) from the next lower odd-numbered comparator 320 in order in V2D comparator stage 120, which is two zone thresholds away. In this arrangement, the fixed "1" level at an input of NAND gate 419 corresponds to the lowest amplitude voltage in the input range of ADC 100, which the sampled input differential voltage VIN is necessarily above. According to this arrangement of NAND gates 411, 413, 415, 417, the output of the odd-numbered critical comparator 320 for a given input sample will be delayed relative to the other outputs, as the residue received at that comparator will be the smallest among the odd-numbered comparators.

For the example described above relative to Table 1, NAND gate 413 presents a logic "0" level at its output if the sampled input differential voltage is between the zone threshold for comparator 320(7) (e.g., +125 mV) and the zone threshold for comparator 320(5) (e.g., 0 mV), as that condition would result in both of outputs OUTM7 and OUTP5 being at a "1" level. NAND gates 411, 415, 417, 419 similarly respond to whether the sampled input differential voltage VIN lies between the zone thresholds of the comparators 320 driving their inputs. It will be apparent that the output of only the one of NAND gates 411, 413, 415, 417, 419 coupled to the odd-numbered critical comparator 320 will be at a "0" level for a given input sample. In addition, the delay of the output logic transition to the "0" level of that one of NAND gates 411, 413, 415, 417, 419 will be inversely indicative of the differential between the residue voltage and the nearest zone threshold among the odd-numbered comparators 320.

NAND gate 420 has inputs coupled to the outputs of NAND gates 411, 413, 415, 417, 419, and operates to produce a single output signal at output FOLDM for the smallest odd-numbered residue. Because the output of only one of NAND gates 411, 413, 415, 417, 419 transitions from a "1" level to a "0" level for a given input sample while the others maintain at a "1" output level for that sample, output FOLDM of NAND gate 420 will make a "0" to "1" transition in response to the "1" to "0" transition of that one NAND gate. The delay of the output logic transition to the "1" at output FOLDM will be inversely indicative of the differential between the residue voltage and the nearest zone threshold among the odd-numbered comparators 320 in V2D comparators stage 120.

In addition to the delay of the transitions at outputs FOLDP, FOLDM of folding logic 130 indicating the magnitude of the residue relative to the relevant zone threshold, the order in which outputs FOLDP, FOLDM make the transition from a "0" level to a "1" level indicates whether the residue is nearer the zone threshold of an even-numbered or an odd-numbered comparator 320. More specifically, folding logic 130 shown in FIG. 4A is arranged so that its NAND gates receive the outputs of comparators 320 two places apart in the ordered sequence of comparators 320 (and node pairs VP/M1 through VP/M9). This arrangement of folding logic 130 facilitates conversion of an input differential voltage at or near a midpoint of an input range zone.

Figure 4B:
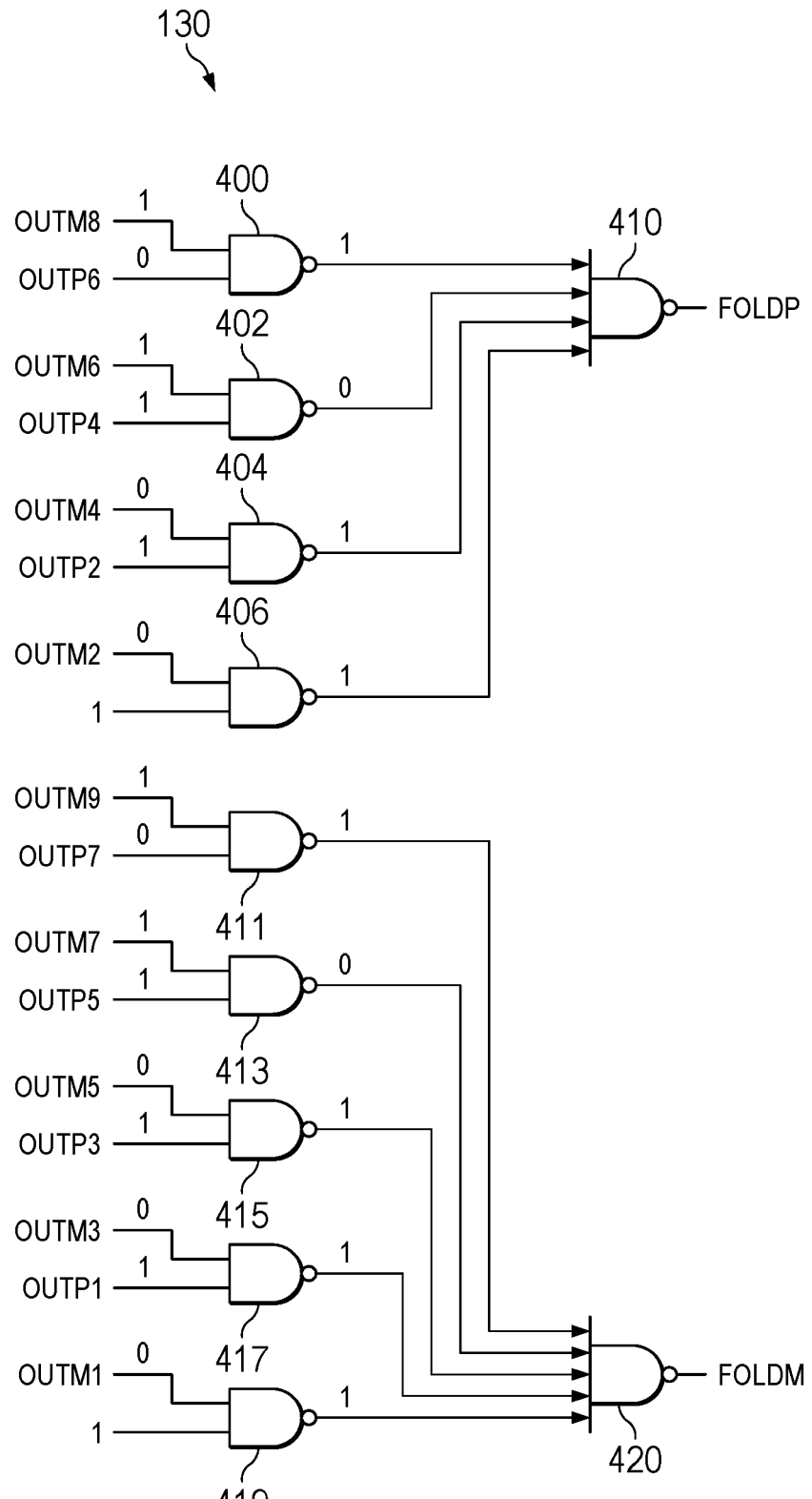
FIG. 4B is an electrical diagram, in schematic form, illustrating an example of the operation of the folding logic of FIG. 4A according to example embodiments.
Figure 4C:
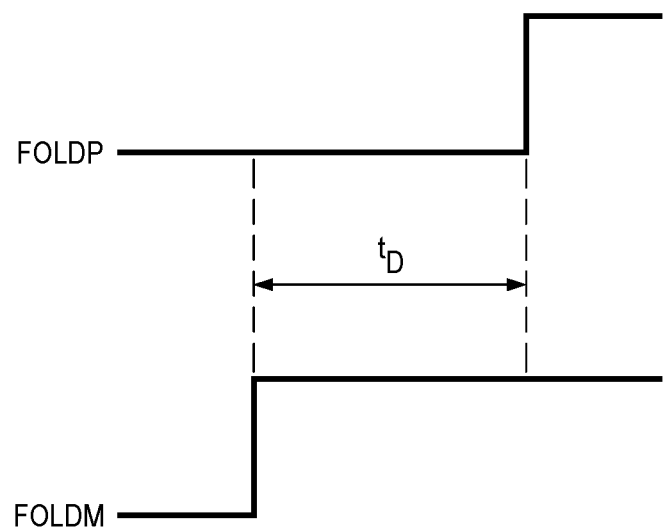
FIG. 4C is a timing diagram illustrating a delay domain signal from the example illustrated in FIG. 4B.

An example of the operation of folding logic 130 according to this example embodiment is illustrated in FIG. 4B and FIG. 4C, for the case in which the input differential voltage VIN is +62 mV. For this input voltage of +62 mV, the differential residues at node pairs VP/M9 through VP/M1 relative to the zero-crossing reference for each of those pairs is shown in Table 2:

TABLE 2

| Node pair | Zero-crossing reference (comparator zone threshold) | Residue relative to zero-crossing reference | Comparator output levels |
|---|---|---|---|
| VP9-VM9 | +250 mV | −188 mV | OUTP9 = 0 |
| | | | OUTM9 = 1 |
| VP8-VM8 | +187.5 mV | −125.5 mV | OUTP8 = 0 |
| | | | OUTM8 = 1 |
| VP7-VM7 | +125 mV | −63 mV | OUTP7 = 0 |
| | | | OUTM7 = 1 |
| VP6-VM6 | +62.5 mV | −0.5 mV | OUTP6 = 0 |
| | | | OUTM6 = 1 |
| VP5-VM5 | 0 mV | +62 mV | OUTP5 = 1 |
| | | | OUTM5 = 0 |
| VP4-VM4 | −62.5 mV | +124.5 mV | OUTP4 = 1 |
| | | | OUTM4 = 0 |
| VP3-VM3 | −125 mV | +187 mV | OUTP3 = 1 |
| | | | OUTM3 = 0 |
| VP2-VM2 | −187.5 mV | +249.5 mV | OUTP2 = 1 |
| | | | OUTM2 = 0 |
| VP1-VM1 | −250 mV | +312 mV | OUTP1 = 1 |
| | | | OUTM1 = 0 |

As described above, the input sample differential voltage of +62 mV is thermometer coded by V2D comparator stage 120 into a code word in which positive outputs OUTP5 and below in the ordered sequence from comparators 320 are at a "1" level and in which output OUTP6 and above in the ordered sequence are at a "0" level. The negative outputs OUTM9 through OUTM1 have the opposite states from their corresponding positive outputs.

FIG. 4B illustrates folding logic 130 with the logic levels at the NAND gate inputs shown for this case, based on the results of comparators 320 as shown in the right-hand column of Table 2. In this example, only NAND gate 402 in the group of NAND gates 400, 402, 404, 406, and NAND gate 413 in the group of NAND gates 411, 413, 415, 417, 419 present a "0" output logic level, in that the input differential voltage of +62 mV lies between the zone thresholds of comparator 320(5) and 320(6). Accordingly, NAND gate 410 drives a "0" to "1" transition at its output FOLDP in response to the output of NAND gate 402 driving a "1" to "0" transition at its output, and NAND gate 420 drives a "0" to "1" transition at its output FOLDM in response to the output of NAND gate 413 driving a "1" to "0" transition at its output. The order in which outputs FOLDP, FOLDM make their transition indicates whether, in this example, the input differential voltage VIN is closer to the zone threshold of comparator 320(6) (e.g., FOLDM transitions before FOLDP) or closer to the zone threshold of comparator 320(5) (e.g., FOLDP transitions before FOLDM).

Referring to Table 2, the differential residue at node pairs VP/M5 is +62 mV, while the residue at node pairs VP/M6 is −0.5 mV. Accordingly, the logic "1" level driven by comparator 320(6) at output OUTM6 will be delayed from the logic "1" level driven by comparator 320(5) at output OUTP5, because the magnitude of the differential of the residue relative to the zone threshold at comparator 320(6) is much smaller than that at comparator 320(5). NAND gate 420 will thus receive the logic "0" level from NAND gate 413 and correspondingly drive a "1" level at its output FOLDM sooner than NAND gate 410 will receive the logic "0" level from NAND gate 402 and correspondingly drive a "1" level at its output FOLDP. In this example, output FOLDM switching before output FOLDP indicates that the input sample differential voltage is closer to the zone threshold of +62.5 mV at comparator 320(6) than to the zone threshold of 0 mV at comparator 320(5).

FIG. 4C illustrates the relative timing between the transition at output FOLDM of NAND gate 420 and the transition at output FOLDP of NAND gate 410 in this example. The delay $t_D$ between the transition at output FOLDM and the transition at output FOLDP corresponds to the relative difference between the difference of the residue at node pair P/M5, as expressed by the timing of the transition at the output of NAND gate 413, to the residue at node pair P/M6, as expressed by the timing of the transition at the output of NAND gate 402. In this example, the input sample differential voltage of +62 mV has a residue of +62 mV at node pair P/M5 relative to the zone threshold of 0 mV at comparator 320(5), and a residue of −0.5 mV at node pair P/M6 relative to the zone threshold of +62.5 mV at comparator 320(6).

Referring back to FIG. 1, outputs FOLDP, FOLDM from folding logic 130 are coupled to time-to-digital (TDC) converter 140 for encoding into n bits of digital output word DOUT. TDC converter 140 according to this implementation may be constructed according to any one of a number of conventional approaches including a delay-line based TDC architecture, a digital counter based architecture, an interpolator-based architecture such as described in the above-incorporated U.S. Pat. No. 10,673,452, and the like.

As noted above, conversion of a voltage into the delay domain can be based on a non-linear relationship, such that the delay signal varies non-linearly (e.g., logarithmically) with input voltage magnitude. Digital stage 160 may thus further include LUT 145 for correcting such non-linearities. For example, TDC converter 140 may present a digital value resulting from conversion of the delay between the transitions at outputs FOLDP, FOLDM as an address to LUT 145, in response to which LUT 145 returns a corresponding digital value corrected for the non-linear relationship. The result output by LUT 145 may be directly output as the n bits of output digital word DOUT in some implementations.

Figure 5:
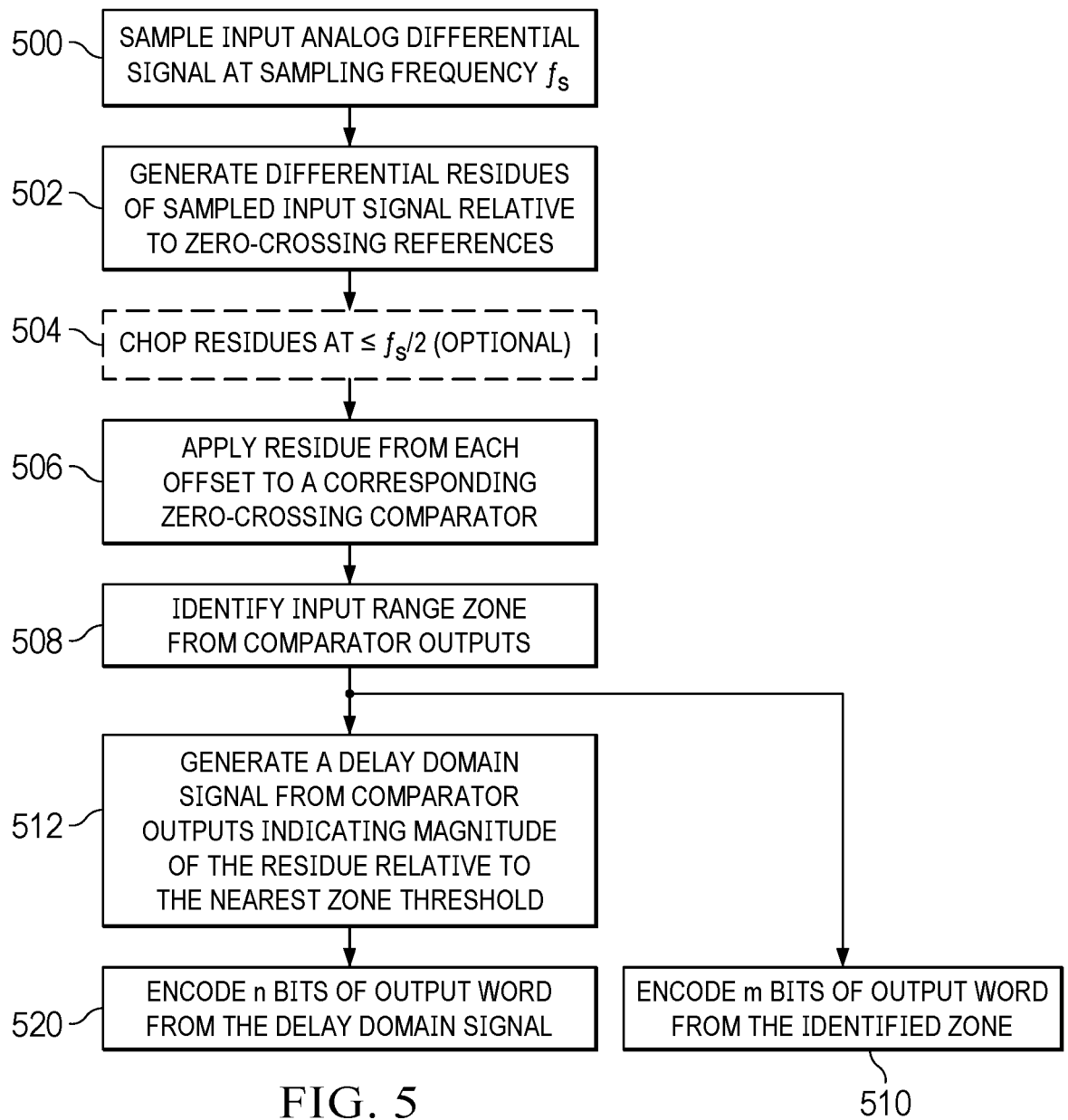
FIG. 5 is a flow diagram illustrating the operation of the analog-to-digital converter of FIG. 1 according to example embodiments.

FIG. 5 illustrates a method of operation of ADC 100 in converting an analog input differential voltage to a digital data word via delay domain conversion according to example embodiments. This method may be applied in a wide range of applications, including for example in direct-sampling RF receivers for multiple-in-multiple-out (MIMO) wireless network and communications systems.

The method begins with process 500 in which a received analog signal is sampled at a preselected sampling frequency $f_s$. A/D conversion according to the method of FIG. 5 may be applied to each of the samples obtained in process 500 to produce a stream of digital output data corresponding to the received signal, for processing in the digital domain. While the method of FIG. 5 will be described for a single sample, it is to be understood that each sample obtained for the signal will be similarly converted to digital at the desired data rate.

In process 502, the sampled input signal, in the form of a differential voltage, is applied to multi-bit input buffer 110 to generate a set of residues of the input differential voltage relative to a number of zero-crossing references. In some implementations, chopping of the residues generated in process 502 may be performed in process 504, for example by mixing the residues with a chopping signal such as a PRBS sequence at a frequency at or less than one-half the sampling frequency f s of sampling process 500. Chopping process 504 reduces the effects of flicker noise, and as such may be omitted if the effects of flicker noise in ADC 100 is otherwise tolerable.

In process 506, the differential residues generated in process 502 are applied to corresponding zero-crossing comparators 320 in V2D comparator stage 120. If chopping process 504 is performed, the same chopping signal is also applied to the comparators used in process 502. In example embodiments, each comparator 320 used in process 506 issues a single-ended output signal (or complementary single-ended signals) in response to the differential residue at its input, with the delay in that output signal inversely related to the magnitude of the residue. The result output by each comparator 320 indicates the comparison of the input differential voltage relative to a zone threshold corresponding to the zero-crossing reference for the residue at its inputs.

In process 508, the input range zone in which the input sample lies is identified from the single-ended output signals from comparators 320. Considering comparators 320 as an ordered sequence according to the associated zero-crossing references of their input residues, the input range zone is indicated by the neighboring pair of comparators 320 having output signals of opposite polarity (i.e., the "critical" comparators). For example, the logic levels of the outputs of comparators 302 from process 508 may indicate a thermometer coded indication of the input range zone in which the input sample lies. In process 510, n bits of an output digital word are encoded from the zone identified in process 508.

In process 512, some or all of the outputs of comparators 320 from process 508 are applied to folding logic 130 to generate a delay domain signal indicating the magnitude of the residue relative to the nearest zone threshold. In this implementation, the delay domain signal is generated in process 512 by folding logic 130 issuing a pair of output signal transitions (e.g., at outputs FOLDP, FOLDM described above) with a relative delay corresponding to the magnitude of the residue relative to the nearest zone threshold. As described above, folding logic 130 is configured to generate its output signals based on the output from the critical comparators 320 having zone thresholds on either side of the input range zone, with the output signal making the later transition indicating which zone threshold is the nearer. In the example of FIG. 4B described above, if the transition at output FOLDP from NAND gate 410 lags that at output FOLDM from NAND gate 420, the even-numbered one of the critical comparators 320 (comparator 320(6) in that example) corresponds to the nearer zone threshold. Conversely, if the transition at output FOLDM from NAND gate 420 lags that at output FOLDP from NAND gate 410, the odd-numbered one of the critical comparators 320 (comparator 320(5) in that example) corresponds to the nearer zone threshold.

In process 520, TDC 140 in digital stage 160 of ADC 100 encodes n bits of digital output word DOUT from the delay domain signal generated in process 512. In this example, encoding process 520 is based on the relative delay of the output signal transitions generated in process 512, and the polarity of that delay (e.g., which of outputs FOLDP, FOLDM lags the other). As described above, process 520 may include generating address data in response to the delay domain signal from process 512, and applying that address data to LUT 145 to retrieve a corresponding digital value (e.g., the n output bits) which has been corrected for non-linearities resulting from the analog-to-delay domain conversion performed in processes 506 through 512.

The digital output word DOUT including the m bits encoded in process 510 and the n bits encoded in process 520, together representing the sampled input differential voltage obtained in process 500, can then be forwarded to the appropriate downstream circuitry for processing according to the application in which ADC 100 is being used. The method of FIG. 5 is of course repeated for each of the samples in the sample stream obtained in process 500, to produce a digital data stream representative of the received input signal.

Important advantages can be attained from the example embodiments described in this specification. Configuration of a multi-bit input buffer to produce zero-crossing residues enables chopping to be applied to those residues rather than to the input signal, eliminating additive flicker from the T2D conversion. Identical zero-crossing comparators producing single-ended outputs according to example embodiments can simplify the folding logic to eliminate the need for parallel TDC circuitry to accurately identify the input range zone. The substantially digital architecture of the ADC enables efficient implementation of the ADC from the standpoint of chip area, and a reduction in power consumption.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. An analog-to-digital converter circuit, comprising:
   a multi-bit input buffer having a differential input adapted to receive a differential input sample, and configured to generate, at a plurality of differential outputs, a plurality of residues of the input sample relative to a corresponding plurality of zero-crossing references;
   a plurality of zero-crossing comparators, each having a differential input adapted to receive one of the residues from one of the differential outputs of the input buffer and having an output, each zero-crossing comparator associated with a zone threshold according to an ordered sequence of zone thresholds;
   a plurality of chopping stages, each coupled to an output of the input stage and to the differential input of a corresponding comparator, and having an input adapted to receive a chop signal;
   folding logic circuitry, having a plurality of inputs, each coupled to the output of one of the comparators, and configured to output a delay domain signal indicating a magnitude of the one of the residues relative to a nearest zone threshold; and
   digital stage circuitry coupled to outputs of the zero-crossing comparators and to outputs of the folding logic circuitry, the digital stage circuitry configured to generate a digital output word corresponding to the received input sample.

2. The circuit of claim 1, wherein the input stage comprises:
   first and second resistor ladders, each comprising a plurality of resistors connected in series;
   first and second transistors, the first transistor having a conduction path between a power supply terminal and the first resistor ladder, the second transistor having a conduction path between the first resistor ladder and a ground terminal, each of the first and second transistors having a control terminal coupled to a first input of the differential input; and
   third and fourth transistors, the third transistor having a conduction path between the power supply terminal and the second resistor ladder, the fourth transistor having a conduction path between the first resistor ladder and the ground terminal, each of the third and fourth transistors having a control terminal coupled to a second input of the differential input;
   wherein each the plurality of differential outputs includes a terminal in the first resistor ladder and a corresponding opposing terminal in the second resistor ladder.

3. The circuit of claim 1, further comprising:
   a sequence generator coupled to the plurality of chopping stages and configured to generate the chop signal in the form of a pseudo-random binary sequence at a chop frequency.

4. The circuit of claim 1, wherein the digital stage circuitry comprises:
   a digital encoder having inputs coupled to outputs of the comparators, and configured to encode one or more bits of the digital output word to indicate an input range zone of the input sample between the zone thresholds associated with neighboring comparators in the ordered sequence having different polarities at their outputs.

5. The circuit of claim 1, wherein the output of each of the comparators include complementary single-ended outputs.

6. The circuit of claim 5, wherein the folding logic circuitry comprises:
a first plurality of logic functions, each having a first input coupled to a negative output of one of the comparators, a second input coupled to a positive output of another one of the comparators two places apart in the sequence from the one of the comparators, and an output;
a first output logic function, having a plurality of inputs each coupled to an output of one of the first plurality of logic functions, and configured to present a logic transition at an output responsive to receiving a latest logic transition at its inputs;
a second plurality of logic functions, each having a first input coupled to a negative output of one of the comparators, a second input coupled to a positive output of another one of the comparators two places apart in the sequence from the one of the comparators, and an output;
a second output logic function, having a plurality of inputs each coupled to an output of one of the second plurality of logic functions, and configured to present a logic transition at an output responsive to receiving a latest logic transition at its inputs.

7. The circuit of claim 6, wherein the inputs of the first plurality of logic functions are coupled to odd-numbered comparators in the sequence and the inputs of the second plurality of logic functions are coupled to even-numbered comparators in the sequence.

8. The circuit of claim 6, wherein the digital stage circuitry comprises:
a digital encoder having inputs coupled to outputs of the comparators, and configured to encode one or more bits of the digital output word to indicate an input range zone of the input sample between the zone thresholds associated with neighboring comparators in the ordered sequence having different polarities at their outputs; and
a time-to-digital converter having a first input coupled to the output of the first output logic function, a second input coupled to the output of the second output logic function, and an output, the time-to-digital converter is configured to present, at its output, one or more bits of the digital output word responsive to a delay time between a logic transition at the output of the first output logic function and a logic transition at the output of the second output logic function.

9. The circuit of claim 8, wherein the digital stage circuitry further comprises:
addressable memory storing a look-up table, having an address input coupled to the output of the time-to-digital converter and having a data output for presenting the one or more bits of the digital output word.

10. A method of converting an analog signal level to a digital word, comprising the steps of:
sampling a differential input signal;
generating, from the sampled input signal, a plurality of differential residue signals relative to a plurality of zero-crossing references;
chopping each of the differential residue signals;
applying each chopped differential residue signal to a corresponding one of a plurality of zero-crossing comparators in an ordered sequence of zone thresholds;
identifying an input range zone for the sampled input signal between the zone thresholds of neighboring comparators in the ordered sequence having a change in polarity at their outputs;
identifying a delay between logic transitions at the neighboring comparators; and
encoding a digital output word indicating the identified input range zone and the identified delay.

11. The method of claim 10, wherein the step of generating the plurality of differential residue signals comprises:
applying a first signal line from the sampled differential input signal to a first resistor ladder, the first resistor ladder having a first plurality of terminals among the resistors in the first resistor ladder, each of the first plurality of terminals coupled to a first input of a corresponding zero-crossing comparator; and
applying a second signal line from the sampled differential input signal to a second resistor ladder, the second resistor ladder having a second plurality of terminals among the resistors in the second resistor ladder, each of the second plurality of terminals coupled to a second input of a corresponding zero-crossing comparator.

12. The method of claim 11, wherein the step of identifying the delay comprises;
generating a first signal responsive to a latest logic transition at the outputs of even-numbered comparators in the sequence;
generating a second signal responsive to a latest logic transition at the outputs of odd-numbered comparators in the sequence, one of the first and second signals being delayed from the other; and
applying the first and second signals to a time-to-digital converter circuit.

13. The method of claim 10,
wherein each of the differential residue signals is chopped at a frequency at or below one-half of a sampling frequency of the sampling step.

14. A voltage-to-delay conversion circuit, comprising:
a multi-bit input buffer having a differential input adapted to receive a differential input sample, and configured to generate, at a plurality of differential outputs, a plurality of residues of the input sample relative to a corresponding plurality of zero-crossing references, the multi-bit input buffer including:
first and second resistor ladders, each comprising a plurality of resistors connected in series;
first and second transistors, the first transistor having a conduction path between a power supply terminal and the first resistor ladder, the second transistor having a conduction path between the first resistor ladder and a ground terminal, each of the first and second transistors having a control terminal coupled to a first input of the differential input; and
third and fourth transistors, the third transistor having a conduction path between the power supply terminal and the second resistor ladder, the fourth transistor having a conduction path between the first resistor ladder and the ground terminal, each of the third and fourth transistors having a control terminal coupled to a second input of the differential input;
wherein each the plurality of differential outputs comprises a terminal in the first resistor ladder and a corresponding opposing terminal in the second resistor ladder;
a plurality of zero-crossing comparators, each having a differential input adapted to receive one of the residues from one of the differential outputs of the input buffer and having an output, each zero-crossing comparator associated with a zone threshold according to an ordered sequence of zone thresholds, so that the outputs of the zero-crossing comparators indicate an input range zone of the input sample between the zone thresholds associated with neighboring comparators in the ordered sequence having different polarities at their outputs; and folding logic circuitry, having a plurality of inputs, each coupled to the output of one of the comparators, and configured to output a delay domain signal indicating a magnitude of the one of the residues relative to a nearest zone threshold.

15. The circuit of claim 14, further comprising:

a plurality of chopping stages, each coupled to an output of the input stage and to the differential input of a corresponding comparator, and having an input adapted to receive a chop signal.

16. The circuit of claim 15, further comprising:

a sequence generator coupled to the plurality of chopping stages and configured to generate the chop signal in the form of a pseudo-random binary sequence at a chop frequency.

17. The circuit of claim 14, wherein the output of each of the comparators comprise complementary single-ended outputs;

and wherein the folding logic circuitry comprises:

a first plurality of logic functions, each having a first input coupled to a negative output of one of the odd-numbered comparators in the sequence, a second input coupled to a positive output of another one of the odd-numbered comparators two places apart in the sequence from the one of the comparators, and an output;

a first output logic function, having a plurality of inputs each coupled to an output of one of the first plurality of logic functions, and configured to present a logic transition at an output responsive to receiving a latest logic transition at its inputs;

a second plurality of logic functions, each having a first input coupled to a negative output of an even-numbered one of the comparators, a second input coupled to a positive output of another one of the even-numbered comparators two places apart in the sequence from the one of the comparators, and an output;

a second output logic function, having a plurality of inputs each coupled to an output of one of the second plurality of logic functions, and configured to present a logic transition at an output responsive to receiving a latest logic transition at its inputs.

18. An analog-to-digital converter having an analog input adapted to receive an analog input signal and having an output adapted to output a digital signal including most-significant bits (MSBs) and least-significant bits (LSBs), the analog-to-digital converter comprising:

a multi-bit input buffer having a buffer input coupled to the analog input and having a plurality of buffer outputs;

a V2D comparator stage having a plurality of V2D inputs, each coupled to a different one of the plurality of buffer outputs and having a plurality of V2D outputs, the V2D comparator stage including:

a plurality of mixers each having a mixer input, a mixer output, and a mixer-chopper input, each mixer input coupled to one of the plurality of V2D inputs and each mixer-chopper input coupled to chopper circuitry configured to generate a pseudo-random binary sequence; and a plurality of comparators each having a comparator input, a comparator output and comparator-chopper input, each comparator input coupled to a corresponding mixer output and each comparator-chopper input coupled to the chopper circuitry, the plurality of comparators configured to output the MSBs of the digital signal; and a folding circuit having a plurality of folding circuit inputs, a plurality of folding circuit outputs, and a plurality of logic gates coupled therebetween, each folding circuit input coupled to a respective comparator output and the folding circuit configured to output the LSBs of the digital signal.

\* \* \* \* \*